United States Patent
Sasaki

(10) Patent No.: US 11,885,716 B2
(45) Date of Patent: Jan. 30, 2024

(54) TEST METHOD OF A SEMICONDUCTOR DEVICE AND MANUFACTURING METHOD OF A SEMICONDUCTOR DEVICE

(71) Applicant: Mitsubishi Electric Corporation, Tokyo (JP)

(72) Inventor: Hajime Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1059 days.

(21) Appl. No.: 16/629,498

(22) PCT Filed: Oct. 10, 2017

(86) PCT No.: PCT/JP2017/036667
§ 371 (c)(1),
(2) Date: Jan. 8, 2020

(87) PCT Pub. No.: WO2019/073519
PCT Pub. Date: Apr. 18, 2019

(65) Prior Publication Data
US 2020/0124492 A1    Apr. 23, 2020

(51) Int. Cl.
*G01M 3/04* (2006.01)
*G01N 25/56* (2006.01)
(Continued)

(52) U.S. Cl.
CPC ............ *G01M 3/047* (2013.01); *G01M 3/16* (2013.01); *G01N 25/56* (2013.01); *H01L 21/78* (2013.01); *H01L 22/26* (2013.01)

(58) Field of Classification Search
None
See application file for complete search history.

(56) References Cited

U.S. PATENT DOCUMENTS 4,920,785 A * 5/1990 Etess .................. G01M 3/229
73/49.3
5,052,818 A    10/1991 Nishizawa et al.
(Continued)

FOREIGN PATENT DOCUMENTS

| JP | S63-134943 A | 6/1988 |
| JP | 2000-135700 A | 5/2000 |

(Continued)

OTHER PUBLICATIONS

International Search Report issued in PCT/JP2017/036667; dated Jan. 16, 2018.
(Continued)

*Primary Examiner* — Daniel S Larkin
(74) *Attorney, Agent, or Firm* — Studebaker & Brackett PC

(57) ABSTRACT

A test method for a semiconductor device comprising a substrate wafer (1), in which an element is formed and a material through which an infrared ray can be transmitted, and a package having an airtight space (7) between a cap wafer (3), which is provided opposite to the substrate wafer (1); and which includes a water applying process in which the semiconductor device is exposed to a high moisture atmosphere and a leak discrimination process in which an infrared ray from the semiconductor device is detected and a leak of the package is discriminated based on absorption of the infrared ray by water molecules.

8 Claims, 10 Drawing Sheets

(51) Int. Cl.
   *G01M 3/16*     (2006.01)
   *H01L 21/66*    (2006.01)
   *H01L 21/78*    (2006.01)

(56) References Cited

U.S. PATENT DOCUMENTS

| | | |
|---|---|---|
| 6,074,891 A | 6/2000 | Staller |
| 6,555,856 B1 | 4/2003 | Staller |
| 2007/0196923 A1 | 8/2007 | Gueissaz et al. |
| 2010/0024525 A1 | 2/2010 | Gueissaz et al. |
| 2010/0064779 A1 | 3/2010 | Gueissaz et al. |

FOREIGN PATENT DOCUMENTS

| | | |
|---|---|---|
| JP | 3187389 B2 | 7/2001 |
| JP | 2003-042926 A | 2/2003 |
| JP | 2004-023054 A | 1/2004 |
| JP | 2008-032658 A | 2/2008 |
| JP | 2010-245348 A | 10/2010 |
| JP | 2011-089997 A | 5/2011 |

OTHER PUBLICATIONS

An Office Action mailed by China National Intellectual Property Administration dated Jun. 29, 2021 which corresponds to Chinese Patent Application No. 201780095626.7 and is related to U.S. Appl. No. 16/629,498 with English language translation.

* cited by examiner

TEST METHOD OF A SEMICONDUCTOR DEVICE AND MANUFACTURING METHOD OF A SEMICONDUCTOR DEVICE

TECHNICAL FIELD

This invention relates to an air tightness evaluation of a semiconductor device having the structure of a wafer level chip scale package (WL-CSP).

BACKGROUND ART

An air tightness evaluation of a semiconductor device is evaluated by a method which is called as a common name a fine leak test, that is, after a device is manufactured, the device is exposed to a helium atmosphere which is pressurized by several pressures, helium is injected to the device having poor airtightness, and helium that invades the device is evaluated by a helium detector (for example, refer to Patent Document 1). Regarding the above mentioned method, it is required for several hours to pressurize helium and detect helium, and thus it is difficult to evaluate devices individually. Therefore, it is required to evaluate several tens to several hundreds of devices all at once. Consequently, in a case where a leak is found, it is necessary to abandon a test lot all at once, or it is necessary to divide devices to a small amount of devices and evaluate them for many times. As a result, there is a problem of having to perform the test many times. Further, in a case where a semiconductor device is a wafer level chip scale package, in comparison with general electronic devices, the volume is smaller and an amount of helium to be injected is small. Therefore, there is a problem such that detection sensitivity of a leak cannot be obtained sufficiently.

Further, regarding a method to test moisture resistance, there is a method in which while a device is operated, the device is exposed to a high temperature, high moisture atmosphere, based on a change of device characteristic, a leak is detected (for example Patent Document 2). According to the above mentioned method, in order to energize each device in the high temperature, high moisture state, an evaluation device having a complicated structure is necessary and there is a problem such that it is required for more than several days to detect a leak.

PRIOR ART DOCUMENT

Patent Document

[Patent Document 1] JP 2004-23054A
[Patent Document 2] JP 2010-245348A

SUMMARY OF THE INVENTION

Problems to be Solved by the Invention

As mentioned above, regarding a fine leak test, it requires time for a test, and in a case where the fine leak test is applied to a wafer level chip scale package, detection sensitivity of a leak cannot be sufficiently obtained. Therefore, test accuracy becomes worse. Further, regarding a method disclosed by Patent Document 2, there is a problem such that it requires time for a test.

This invention is made for solving the above mentioned problems, and an objective of this invention is to provide a test method for a semiconductor device requiring a short amount of time for a test and having high detection sensitivity of a leak in a case where the test is applied to a wafer level chip scale package.

Means for Solving Problems

A test method of a semiconductor device according to this invention is a method to test a semiconductor device having a package with an airtight space, which is provided between a substrate wafer in which an element is formed and a cap wafer, which is made of a material that can transmit an infrared ray and is provided opposite to the substrate wafer. The test method includes a water applying process in which the semiconductor device is exposed to a high moisture atmosphere and a leak discrimination process in which an infrared ray from the semiconductor device is detected. A leak of the package is discriminated based on absorption of the infrared ray by water molecules.

Effect of Invention

According to this invention, in a leak test of a wafer level chip scale package, a test which requires only a short amount of time and has high accuracy can be performed.

MODE FOR CARRYING OUT THE INVENTION

Embodiment 1

Figure 1:
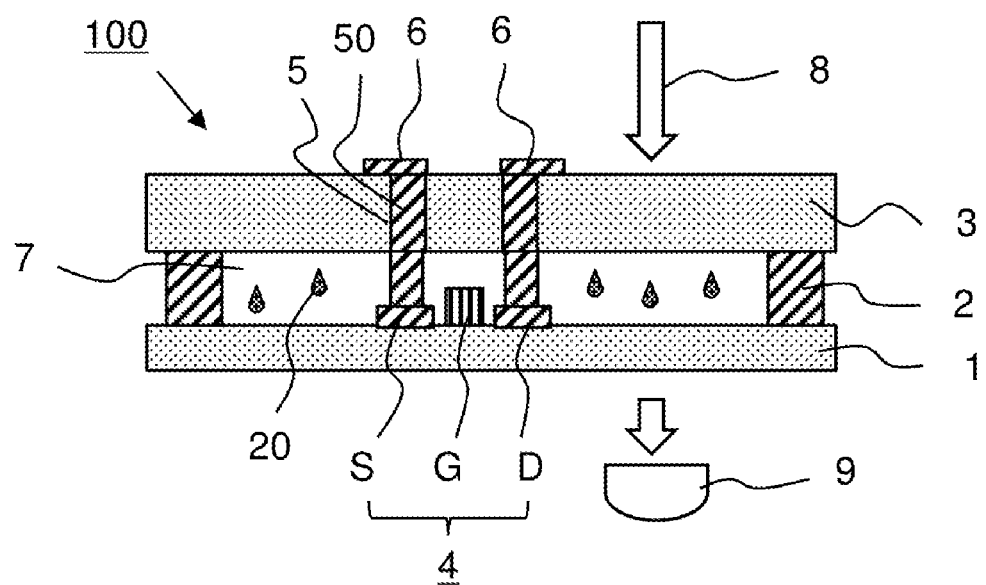
FIG. 1 is a cross-sectional view of a semiconductor device for describing a test method of a semiconductor device according to Embodiment 1 of this invention.

Hereinafter, Embodiment 1 of this invention will be described referring figures. FIG. 1 shows a test method of a semiconductor device according to Embodiment 1 of this invention by using a cross-sectional view of a semiconductor device 100, which is an object of a test. On a substrate wafer 1 which is made of GaAs, for example, a transistor 4 for high frequency amplification is formed. In FIG. 1, as the transistor 4, a FET having a source S, a drain D and a gate G is shown as an example. As the transistor 4, it is not limited to FET, but any element which is formed on the substrate wafer 1, such as a semiconductor element other than a transistor or an integrated circuit is acceptable. Further, in many cases, a circuit which electrically connects between elements is formed. By a cap wafer 3, which is made of GaAs, and a sealing frame 2, which is formed of gold, in an area where the transistor 4 is formed, the cap wafer 3 is provided opposite to the substrate wafer 1 so as to form an airtight space 7 whose air tightness is secured. In order to supply power to the transistor 4, on the cap wafer 3, a penetrating via hole (V/H) 5 is formed. An electrode pad 6 for supplying power from outside is connected to the via hole 5. The semiconductor device 100 having the above mentioned configuration is classified to be a semiconductor device, which is called a wafer level size package.

Conventionally regarding an air tightness test of a semiconductor element that is sealed in a package, a test of helium leak is used, which is disclosed by Patent Document 1, or a method is used in which a device is exposed to a high temperature, high moisture atmosphere and a leak is examined based on a change of device characteristics, which is disclosed by Patent Document 2. Regarding electronic devices, generally, in many cases, a package made of ceramics or resin is used, and a material that does not transmit a light. Therefore, there is not any idea to perform a test of inside of a package by using light. On the other hand, inventors of this invention found out that in a wafer level chip size package, in some cases, a material by which a package is made is the same material as that of the substrate wafer 1 on which elements are formed. For example, a material such as GaAs is used, and GaAs transmits a light in an infrared ray range and water has an absorption band of light in an infrared ray range. As a result of these realizations, the inventors reached an idea of this invention.

Figure 2:
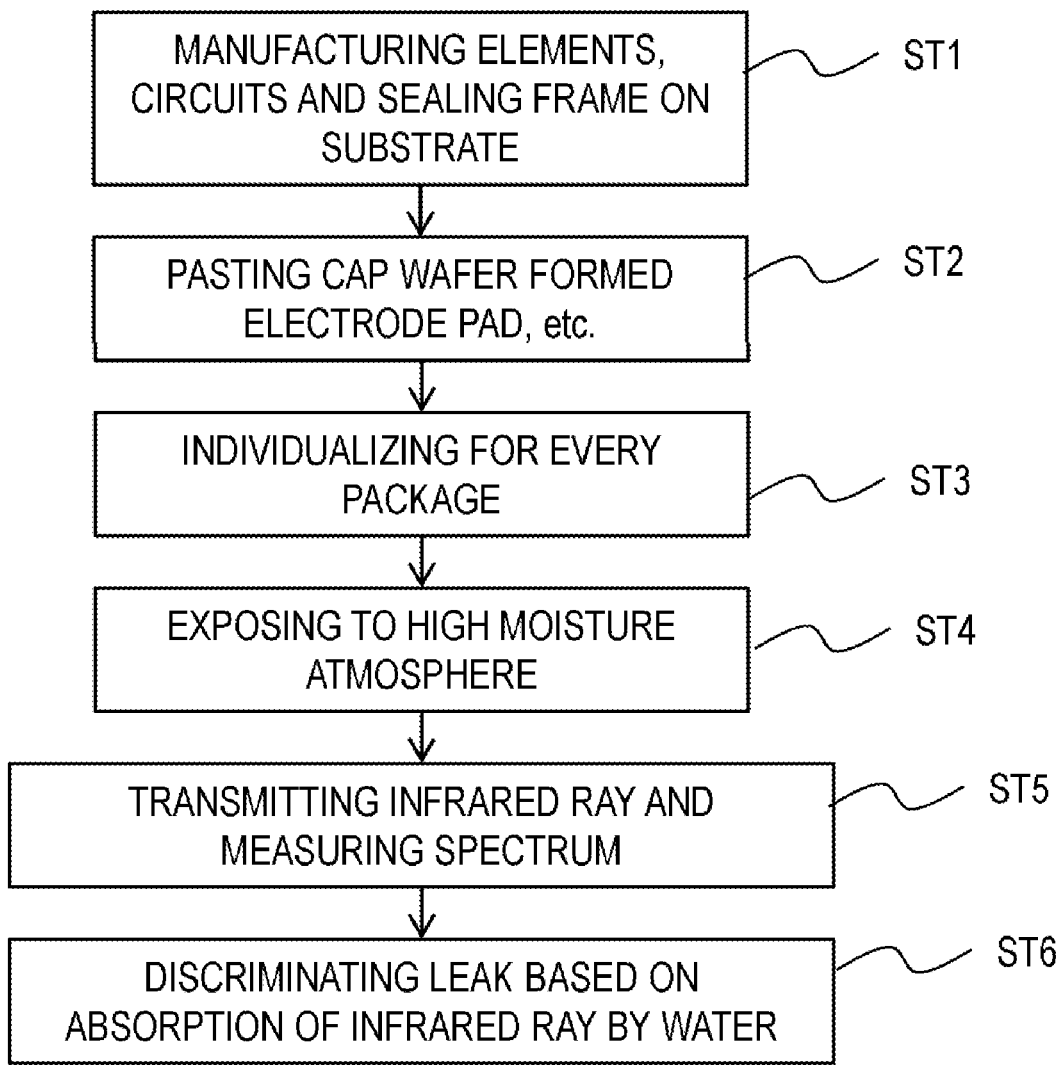
FIG. 2 is flow chart for showing a manufacturing method of a semiconductor device which includes a test method of a semiconductor device according to Embodiment 1 of this invention.

In a test method of a semiconductor device according to Embodiment 1, as shown in FIG. 1, an infrared ray 8 is irradiated through a semiconductor device 100 from outside, by detecting the infrared ray which is transmitted with an infrared ray detector 9, it will be tested whether water 20 is contained in the airtight space 7 of the semiconductor device 100 or not. Hereinafter, the details of a test method will be described by the flow chart of FIG. 2, which includes a manufacturing method of a semiconductor device.

On the substrate wafer, which is made of GaAs 1, the transistor 4 and circuits will be manufactured by general device manufacturing process (Step ST1). At this time, the sealing frame 2 for airtight sealing will be separately manufactured on the substrate wafer 1 (Step ST1). Step ST1 will be referred to as an element forming process. The sealing frame 2 is formed, for example, of aggregation of gold grain, deposition, spattering or plating of gold. In many cases, in order to improve adhesiveness, not only gold, but also a film of Ti, Cr, Pt, Pd, etc. is layered. After that, the substrate wafer 1 and the cap wafer 3, which is made of a material similar to that of the substrate wafer 1 is pasted in a nitrogen atmosphere and high temperature about 300° C. (Step ST2). In order to take out an electrode outside, the via hole 5 and a penetrating electrode 50 and an electrode pad 6 are formed on the cap wafer 3 in advance. FIG. 1 shows an example in which an electrode is taken out from the cap wafer 3 is shown. However, a penetrating electrode may be formed on the substrate wafer 1. As above mentioned, a semiconductor device which is configured by a plurality of packages having the airtight space 7, which is sealed with the sealing frame 2 between the substrate wafer 1 and the cap wafer 3, is individualized by dicing or scribing for every package (Step ST3). Step ST2 and Step ST3 will be referred to as a package forming process.

Packages which are individualized will be exposed to a high moisture atmosphere (Step ST4). Step ST4 will be referred to as a water applying process. Regarding temperature and relative humidity in exposure condition, a standard condition is 85° C./85% for about 1 day or 130° C./85% for about two hours. Generally, in a wafer level chip size package, it is difficult to obtain adhesion between the sealing frame 2 and the substrate wafer 1 and the cap wafer 3, and in some cases, air tightness cannot be sufficiently obtained. In a case where the air tightness is poor, while a device is used, water invades from the outside atmosphere to the airtight space 7 in the package, and by reacting the water and the transistor 4, oxidation of GaAs, corrosion of an electrode, ion migration of metal will be induced so as to cause deterioration of a device. Consequently, securing airtightness is an important subject.

In a test method of a semiconductor device according to Embodiment 1, as an airtightness test, first, a semiconductor device will be exposed to a high moisture atmosphere, and water will be injected acceleratingly and deliberately from a leak part. At this time, in a package where a leak exists, an amount of water inside the package will be increased. After the semiconductor device is exposed to high moisture atmosphere, the infrared ray 8 will be irradiated from outside to transmit through the package, with the infrared ray detector 9 which is provided outside, an infrared ray spectrum will be measured (Step ST5). In a case where a leak exists in a package and water invades to the inside, an infrared ray spectrum which is measured is an absorption spectrum whose strength is lowered by absorption wavelength of water. Consequently, by an absorption spectrum in an infrared ray spectrum that is measured, an absorption by water will be judged, and by a non-destructive test, a leak can be discriminated individually for each package (Step ST6). Step ST5 and Step ST6 will be referred to as a leak discrimination process.

As mentioned above, in Embodiment 1, absorption by water of an infrared ray will be utilized. One of the most sensitive method among the above mentioned methods is FTIR (Fourier transform infrared spectroscopy). By performing Fourier transformation, noise will be removed, and an infrared ray spectrum can be measured with high sensitivity. As the substrate wafer 1 and the cap wafer 3, a band gap of GaAs which is used for a package is 1.42 eV, and when the band gap is transformed to be a wavelength, the band gap is 873 nm. In FTIR, a range of wavelengths from 1 μm to 20 μm will be measured, therefore, GaAs is transparent and an infrared ray, which is used for FTIR, can be transmitted.

In a case where water exists in a light path of FTIR, according to the number of vibration of molecule vibration of a water molecule (expansion vibration, deformation vibration, etc.), molecule vibration will be excited by irradiation light so as to absorb an infrared ray. In a water molecule, in 1.5 μm, 2 μm, 2.5 μm to 3.5 μm, Sum, 5.5 μm to 7 μm, and so on, there are large infrared ray absorption wavelength bands. When pressure is 1 atmospheric pressure and temperature is 25° C. in a package, and pressure reaches saturation pressure, partial pressure of water vapor is 3168 Pa. When water vapor in a package is condensed, a film thickness of water molecules is about 0.1 μm or less, and a range can be detected by using FTIR having high sensitivity. As above mentioned, by irradiating an infrared ray which can be transmitted through the cap wafer 3 and the substrate wafer 1 from outside and which includes an absorption wavelength band of a water molecule, in a case where water exists, an absorption spectrum in the above mentioned infrared ray absorption wavelength band is measured. Therefore, based on absorption of an infrared ray by water, by non-destructive inspection, an increase of an amount of water inside due to a leak can be individually detected.

In Embodiment 1, a case in which GaAs is used is described, however, a wafer level chip size package, in which the substrate wafer 1 and the wafer 3 which are made of other material are used, can be applied. In a case of Si, a band gap is 1.12 eV; therefore, an infrared ray with a wavelength longer than 1.1 μm can be transmitted. Accordingly, a similar test can be performed. In a case of InP, a band gap is 1.35 eV; therefore, a wavelength is 918 nm. In a case of SiC, a band gap is 3.26 eV and a wavelength is 380 nm, and in a case of GaN, a band gap is 3.4 eV and a wavelength is 364 nm. In order to transmit an infrared ray having an absorption wavelength band of a water molecule, by using an infrared ray having a wavelength longer than 1 μm, a similar effect can be obtained.

In the above mentioned, by using FTIR, a spectrum in an infrared ray range is measured, and by an absorption spectrum of a water molecule, a leak is discriminated. As mentioned above, infrared ray absorption wavelength bands are known. Therefore, without using FTIR, as an infrared ray to be irradiated, an infrared ray having any wavelength in an absorption wavelength band of a water molecule may be used. In this case, absorption of water is discriminated not by a spectrum, but by the strength of an infrared ray which transmits through a package, for example, by comparing the strength of an infrared ray which transmits through a package which is a reference such that a leak does not exist, and the strength of an infrared ray which transmits through a package which is an objective to be tested, by discriminating absorption of water of an infrared ray, a leak of the package can be discriminated.

Figure 3:
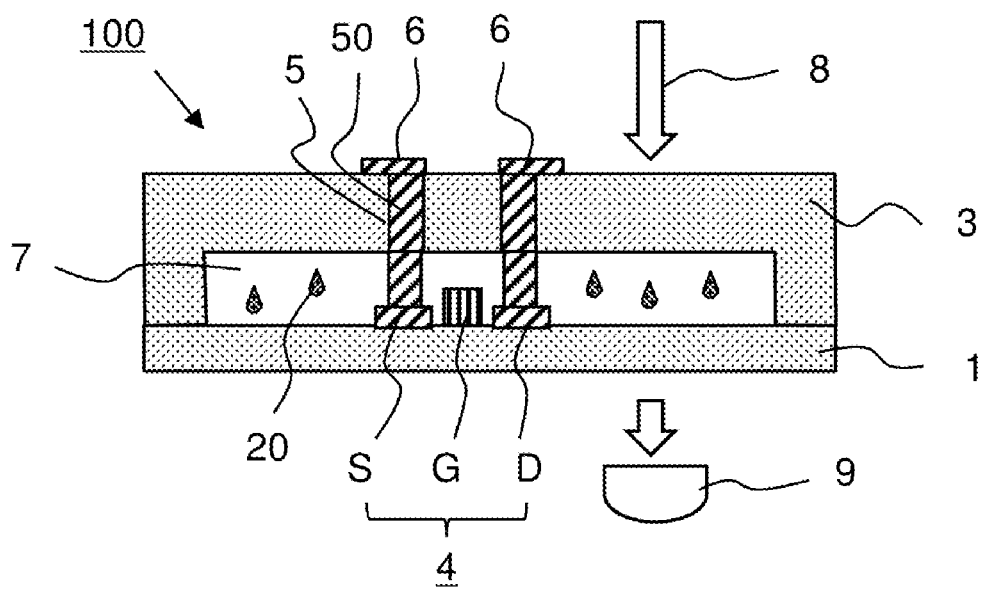
FIG. 3 is a cross-sectional view of another semiconductor device for describing a test method of a semiconductor device according to Embodiment 1 of this invention.

Further, FIG. 1 shows an example of a wafer level chip size package in which a space is formed by the sealing frame 2. However, as shown in FIG. 3, a wafer level chip size package having another shape can be applied, in which airtight space 7 is formed by a cap wafer 3 having a hollow and a substrate wafer 1, or an airtight space is formed by a substrate wafer having hollow and a cap wafer. As above mentioned, a package formed between a semiconductor device, which is configured by a substrate wafer on which an element is formed and a material in which an infrared ray can be transmitted, and a cap wafer provided opposite to the substrate wafer can be applied.

Embodiment 2

Figure 4:
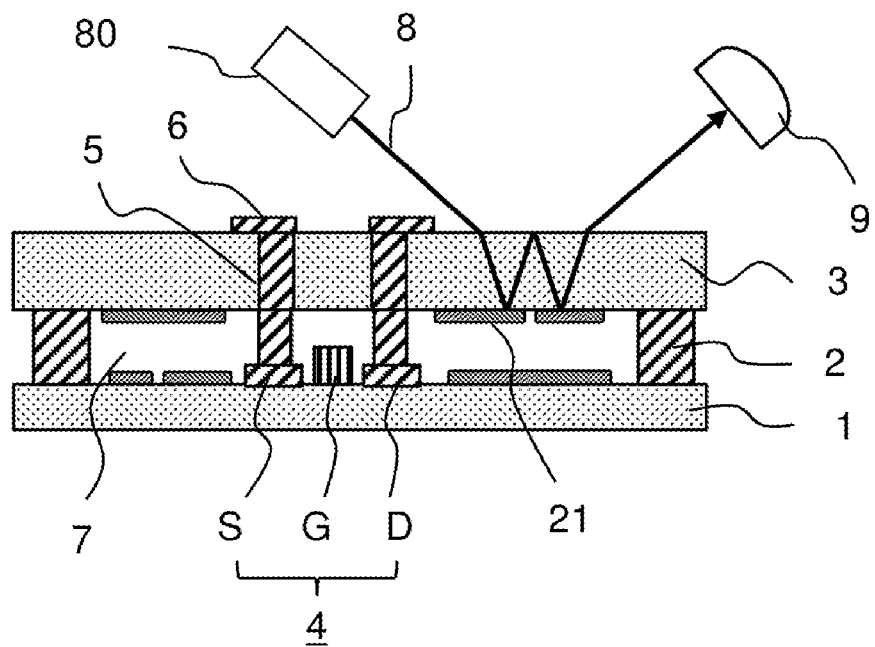
FIG. 4 is a cross-sectional view of a semiconductor device for describing a test method of a semiconductor device according to Embodiment 2 of this invention.
Figure 5:
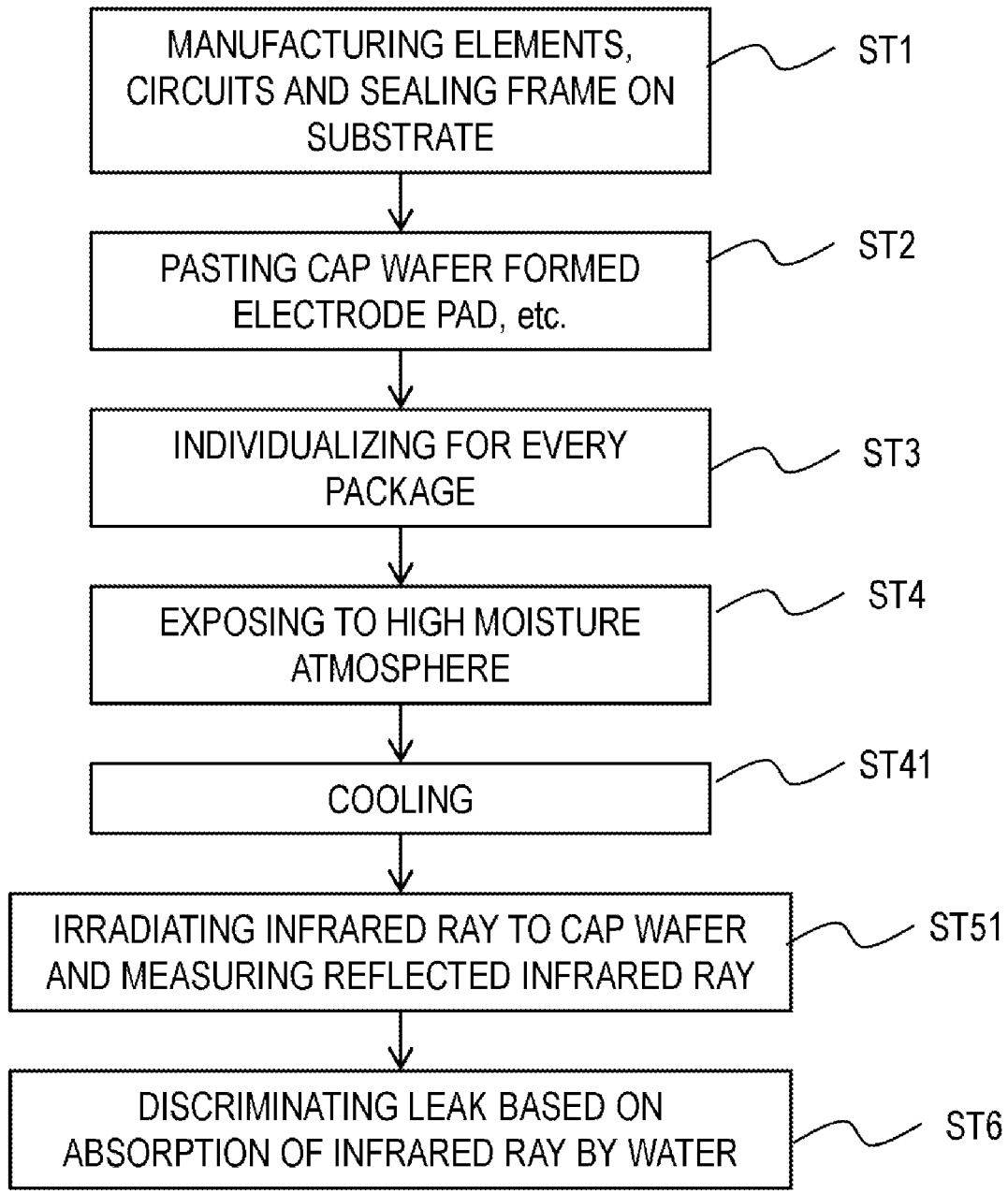
FIG. 5 is flow chart for showing a manufacturing method of a semiconductor device which includes a test method of a semiconductor device according to Embodiment 2 of this invention.

FIG. 4 shows a test method of a semiconductor device according to Embodiment 2 of this invention by using a cross-sectional view of a semiconductor device 100. Further, FIG. 5 is a flow chart for showing a manufacturing method of a semiconductor device. The semiconductor device 100 is the same as that shown in FIG. 1. After the semiconductor device 100 is exposed to a high moisture atmosphere, by cooling the semiconductor device 100, in a package a leak, as shown in FIG. 4, on an inner surface of a substrate wafer 1 and a cap wafer 3, condensation is caused to form a water film 21.

Steps ST1 to ST4 shown in FIG. 5 are the same as those which are described in Embodiment 1. By exposing the semiconductor device 100 to a high moisture atmosphere in the same way as that in Embodiment 1, water is injected to a package with a leak. After that, the whole of the package is cooled (Step ST41), and water condenses to form the water film 21. From an infrared ray source 80 outside, an infrared ray 8 is irradiated, and the infrared ray 8 is transmitted through the cap wafer 3, which is made of a material through which an infrared ray can transmit and is reflected by the water film 21. The reflecting light is radiated outside again, and the infrared ray is detected by a detector 9. An infrared ray spectrum of the reflecting light is measured (Step ST51). In a case where the water film 21 exists, an infrared ray spectrum which is measured is an absorption spectrum whose strength is decreased at an absorption wavelength of water, therefore by an infrared ray spectrum, absorption of water is judged so as to discriminate a leak in a package (Step ST6).

Water which invades into a package by exposing a semiconductor device to a high moisture atmosphere can be converted to the water film 21 by cooling and condensing the water. For example, when a temperature is 25° C. and relative moisture is 50%, a dew point is 13.9° C., when relative moisture is 10%, a dew point is −8.7° C., when relative moisture is 1%, a dew point is −35° C., and when it is cooled to be −65° C., invading water from a minute leak can be almost condensed. Below a freezing point, the water film 21 is in an ice state. However, due to the difference of a hydrogen bond between water molecules, an absorption strength of water is slightly changed from that of ice, even if it is ice, the spectrum which is the same as that of water can be obtained and can be detected.

In a case where it is condensed, it is simple to cool whole of the package. However, it is acceptable that by spraying a cooling wind only to the cap wafer 3, condensation may be caused. As water in a package only at a side of the cap wafer 3 is condensed, therefore, about two times of water film thickness can be secured so as to improve detection sensitivity.

Further, it is acceptable that by cooling only an irradiation part selectively, an infrared ray is irradiated convergently. As the whole of the water in a package converges in a narrow area to be condensed, water can be detected with higher sensitivity.

In Embodiment 1, by transmitting an infrared ray, water inside a package is detected. In Embodiment 2, by reflecting an infrared ray in the cap wafer 3, an infrared ray absorption of water is detected. Regarding FTIR, in a case where an infrared ray is reflected in the cap wafer 3, absorption of deposits can be detected by a seeping effect of light. Further, as shown in FIG. 3, by causing multiple reflection, detection sensitivity can be improved dramatically, and trace amounts of water can be detected with excellent sensitivity. Further, according to a method of Embodiment 2, an infrared ray which is reflected in the cap wafer 3 is measured. Therefore, the method of Embodiment 2 can be applied to a semiconductor device which is made of a material through which the substrate wafer 1 cannot transmit an infrared ray.

Further, in the same way as that which is described in Embodiment 1, without using FTIR, as an infrared ray to be irradiated, an infrared ray having any wavelength in an absorption wavelength of a water molecule may be used. In this case, existence of water is not judged based on a spectrum, but by measuring strength of an infrared ray which is reflected from the cap wafer 3, for example, by comparing the strength of an infrared ray which is reflected from a cap wafer of a package which is a reference such that the leak does not exist, and the strength of an infrared ray which is reflected from a cap wafer 3 of a package which is an objective to be tested, to discriminate the absorption of water.

Embodiment 3

Figure 6:
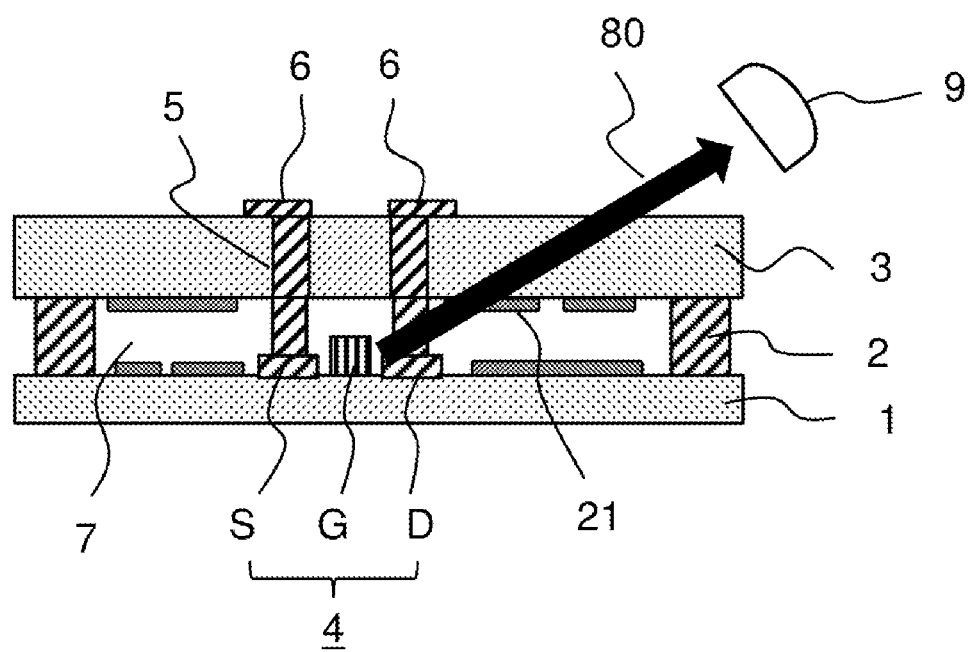
FIG. 6 is a cross-sectional view of a semiconductor device for describing a test method of a semiconductor device according to Embodiment 3 of this invention.
Figure 7:
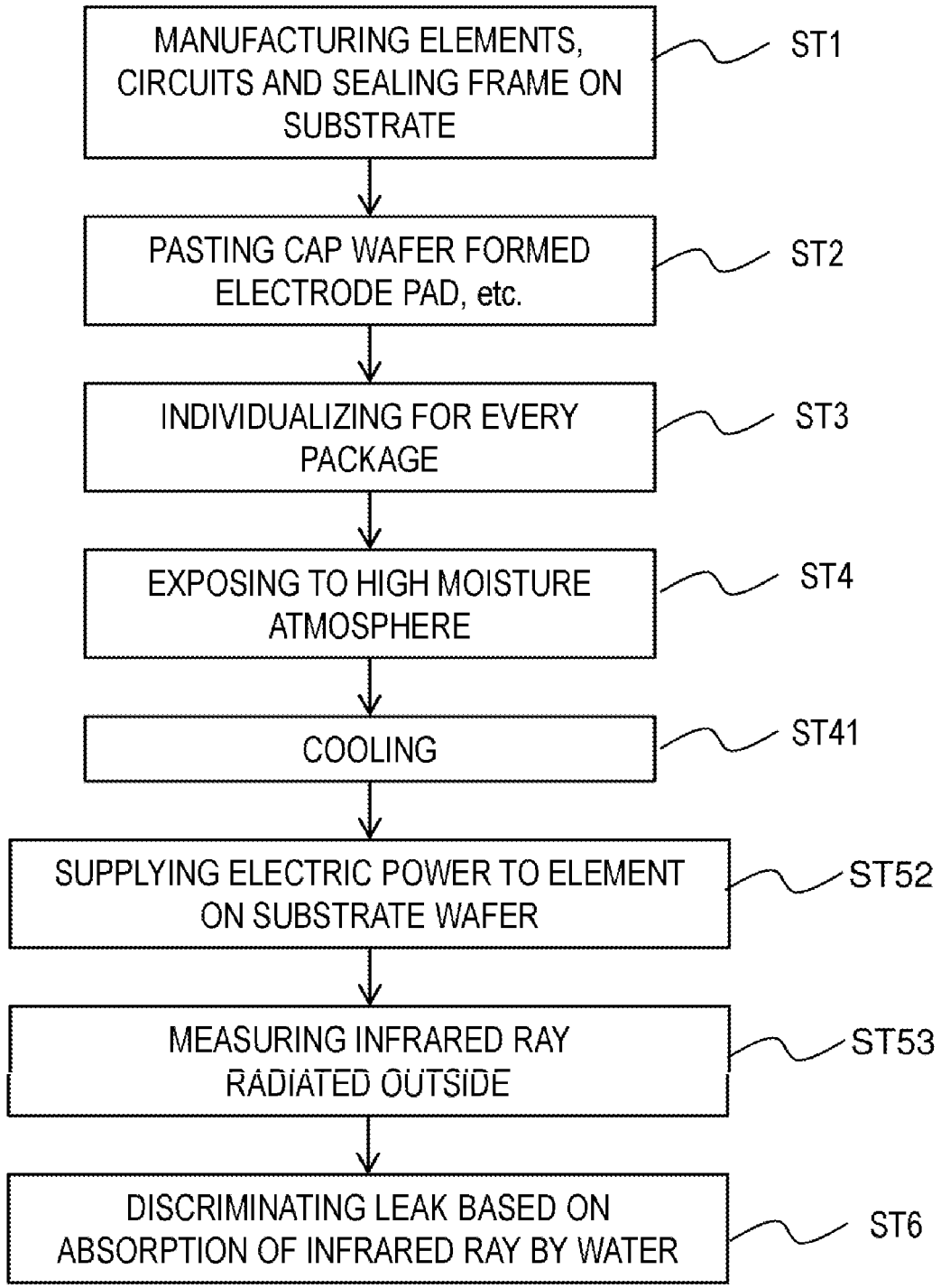
FIG. 7 is flow chart for showing a manufacturing method of a semiconductor device which includes a test method of a semiconductor device according to Embodiment 3 of this invention.

FIG. 6 is a diagram for describing a test method of a semiconductor device according to Embodiment 3 of this invention by using a cross-sectional view of a semiconductor device 100 which is an objective of the test. Further, FIG. 7 is flow chart showing a manufacturing method of a semiconductor device. A semiconductor device 100 is the same as that which is shown in FIG. 1.

In the same way as that of Embodiment 1, by exposing a package to a high moisture atmosphere (Step ST4), water will be injected to a package with a leak. After that, the whole of the package will be cooled (Step ST41) and by condensing water, as shown in FIG. 6, a water film 21 will be formed. Next, when electric power is supplied to an element which is formed on a substrate wafer, such as a transistor (Step ST52) so as to operate an element, the element will generate heat so as to radiate an infrared ray 80. By transmitting the infrared ray through the water film 21 and by measuring a spectrum of an infrared ray which is radiated outside of a package, the water film 21 will be detected. FIG. 6 shows an example in a case where the water film 21 is formed. However, measuring can be performed even in a case of a water vapor state as shown in FIG. 1.

Generally, when a transistor is operated, a temperature will be several ° C. to several tens ° C., when a large current is flown flows, in some cases, a temperature of a transistor part reaches 100° C. In the above mentioned high temperature state, an infrared ray is generated by radiation. With regard to a wavelength, the infrared ray is comparatively a uniform continuous light. In a case where water vapor exists in the water film 21 or in airtight space 7, regarding an infrared ray which is generated, an infrared ray in absorption wavelength band of a water molecule will be absorbed by the water film 21 or water vapor so as to be a characteristic spectrum, and by measuring the spectrum of an infrared ray with a detector 9, an absorption of water can be judged. In comparison with the above mentioned Embodiments, an irradiation light source is not necessary. Therefore, a detection device can be made to be simple. An infrared ray can be generated independently only in a package which is operated. Therefore, an infrared ray can be measured by using a cheap detector which measures a plurality of packages simultaneously and extensively. By operating elements of different packages sequentially, based on an absorption spectrum of water in a spectrum of an infrared ray which is measured every time when an element is operated, a leak in each package can be discriminated. Further, in the method of Embodiment 3, an infrared ray which transmits through a cap wafer 3 is measured, therefore, the method can be applied to a semiconductor device which is made of a material through which the substrate wafer 1 cannot transmit an infrared ray.

Embodiment 4

Figure 8:
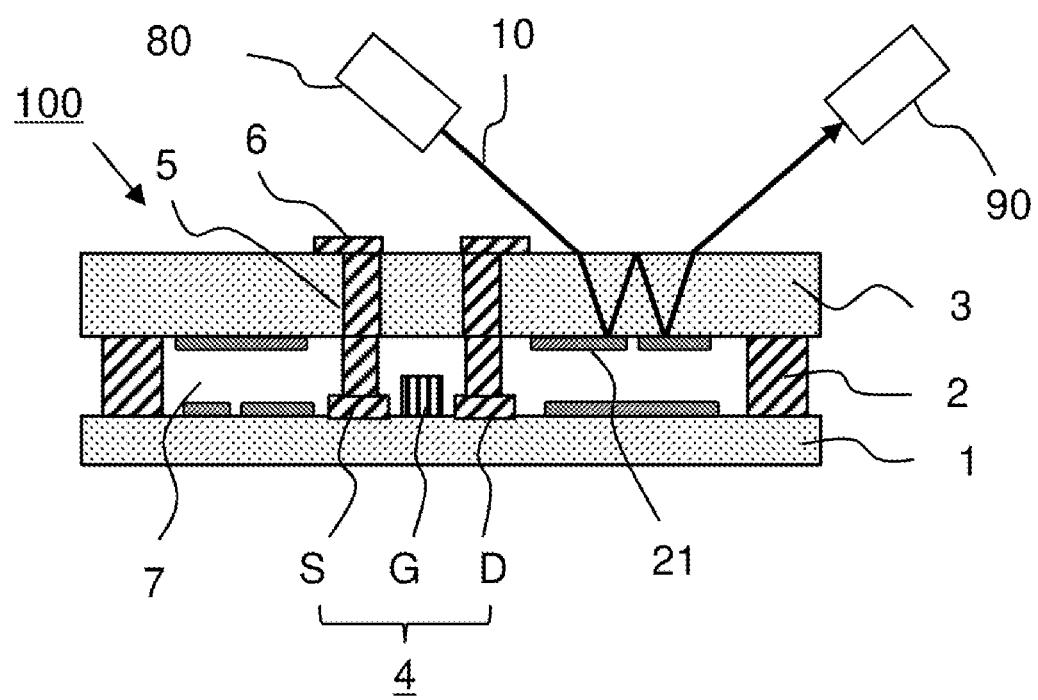
FIG. 8 is a cross-sectional view of a semiconductor device for describing a test method of a semiconductor device according to Embodiment 4 of this invention.
Figure 9:
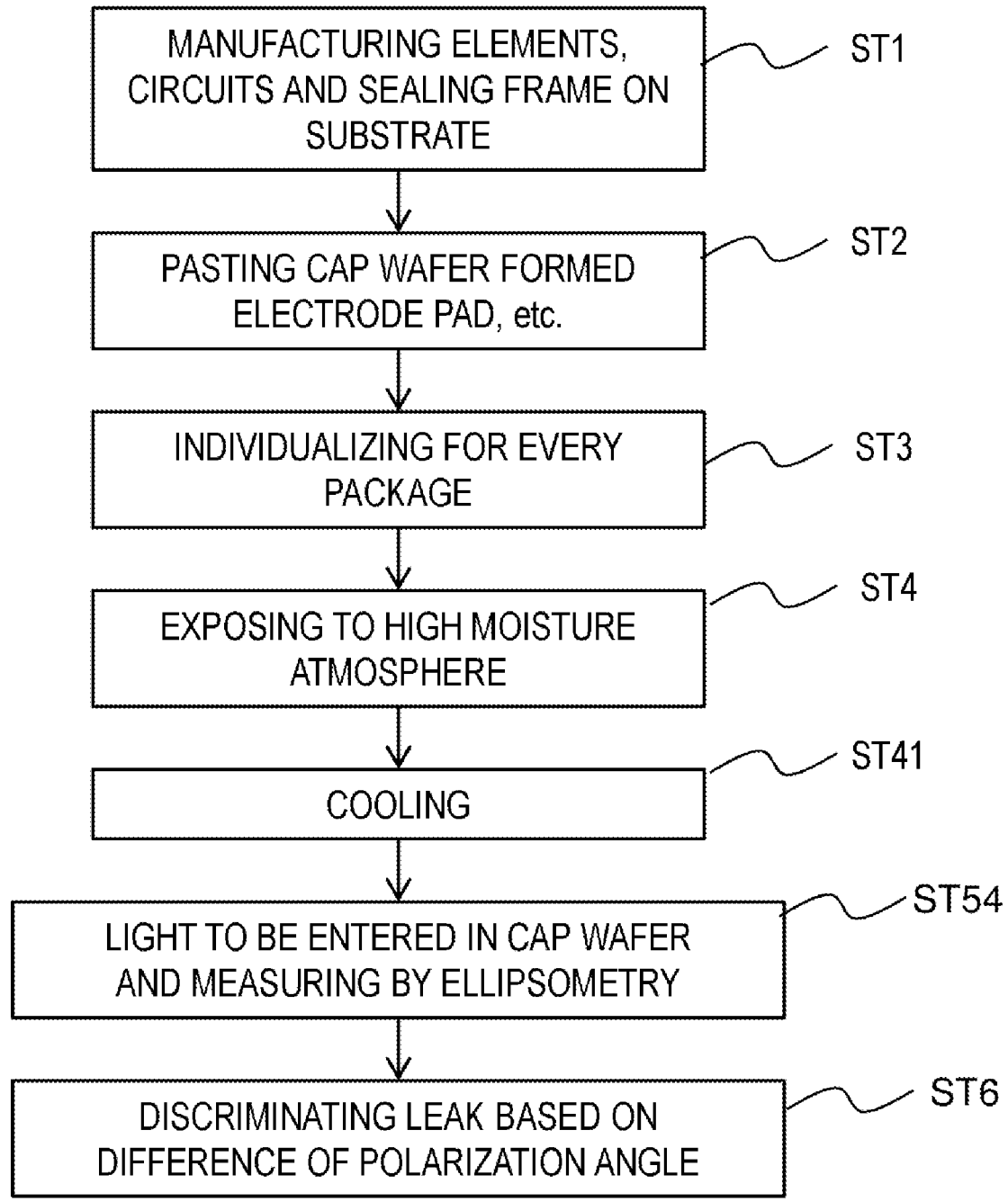
FIG. 9 is flow chart for showing a manufacturing method of a semiconductor device which includes a test method of a semiconductor device according to Embodiment 4 of this invention.

FIG. 8 is a diagram for describing a test method of a semiconductor device according to Embodiment 4 of this invention by using a cross-sectional view of a semiconductor device 100, which is an objective of test. Further, FIG. 9 is flow chart showing a manufacturing method of the semiconductor device. A semiconductor device 100 is the same as that shown in FIG. 1. After the semiconductor device 100 is exposed to a high moisture atmosphere, by cooling the semiconductor device 100, in a package which has a leak, as shown in FIG. 8, on an inner surface of a substrate wafer 1 and a cap wafer 3, water is condensed so as to form a water film 21.

As described in Embodiment 2, it is acceptable that by spraying cooling wind only to the cap wafer 3, water is condensed. Further, it is also acceptable that by selectively cooling only an irradiation part, an infrared ray is focused and is irradiated.

An infrared ray 10 is made incident from an infrared ray source 8 outside to the cap wafer 3 of the semiconductor device 100, the infrared ray 10 is transmitted through the cap wafer 3 so as to be reflected on the water film 21. A reflecting light is radiated outside again, and the light is detected by the detector 90. In order to perform polarization spectroscopy of reflected light, a principle of ellipsometry is used (Step ST54).

In ellipsometry, a polarization angle of reflected light with regard to incident light will be monitored. When a water film having a refractive index and dispersion, which are different from those of a cap wafer adheres to a cap wafer, a polarization angle is different from that in a case where the water film does not adhere to a cap wafer, and therefore a water film can be detected. Detection sensitivity is high, and when a water film of several atom layers exists, a water film can be detected, and therefore even when a slight of leak exists, a water film can be detected. In FIG. 8, multiple reflection are made in the cap wafer 3. According to the number of reflections, detection sensitivity can be improved. Of course, when only one reflection occurs, sufficient detection sensitivity can be obtained.

In the above mentioned, an infrared ray is used as a light for ellipsometry. However, a visible light transmits in a case where the cap wafer 3 is formed of GaN, for example. Therefore, by using a visible light, with ellipsometry, a polarization angle can be detected. As mentioned above, in Embodiment 4, in which ellipsometry is used, not by utilizing infrared ray absorption of water molecules, but utilizing a polarization angle of reflected light, existence of water film is detected. Therefore, it is not limited to a light in an infrared ray area, but by making a light including a light having a wavelength which can transmit into a material of the cap wafer 3 incident, existence of a water film can be judged by ellipsometry, and a leak can be discriminated.

Embodiment 5

Figure 10:
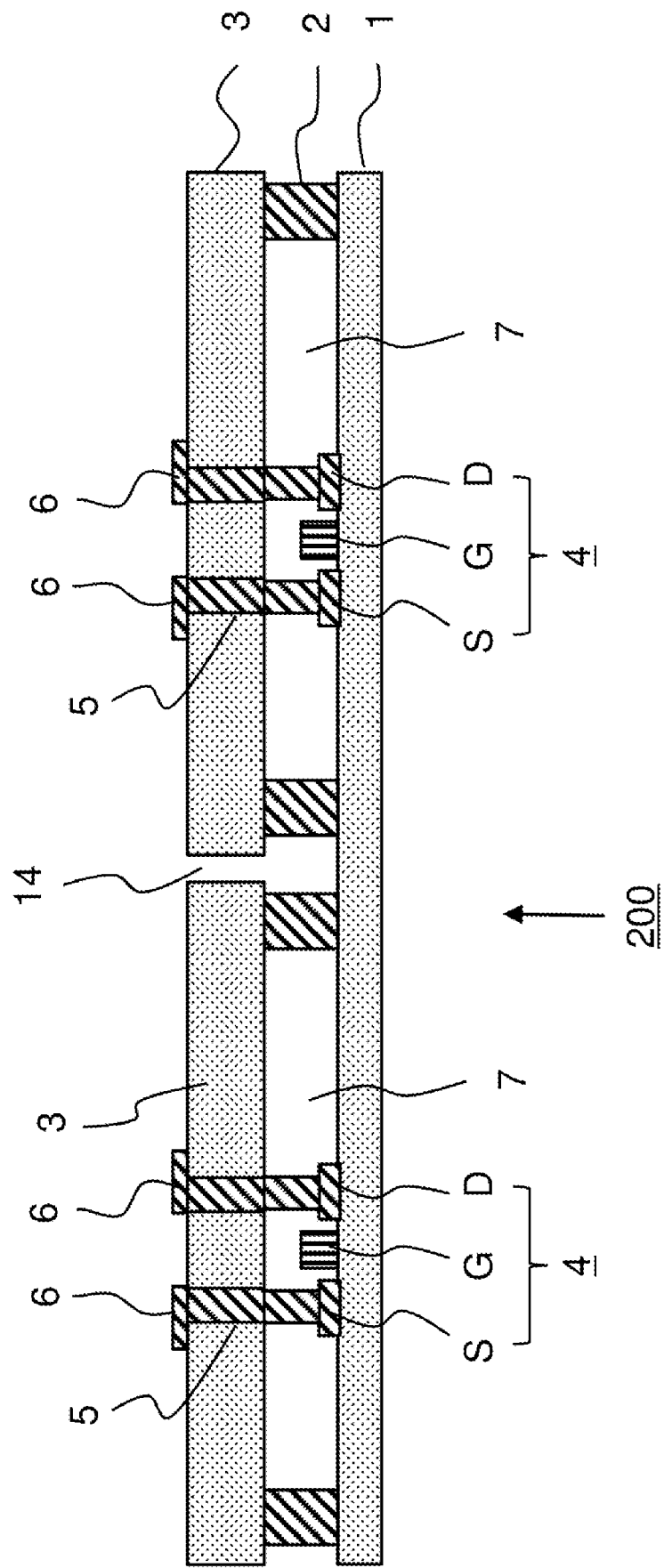
FIG. 10 is a cross-sectional view of a semiconductor device for describing a test method of a semiconductor device according to Embodiment 5 of this invention.
Figure 11:
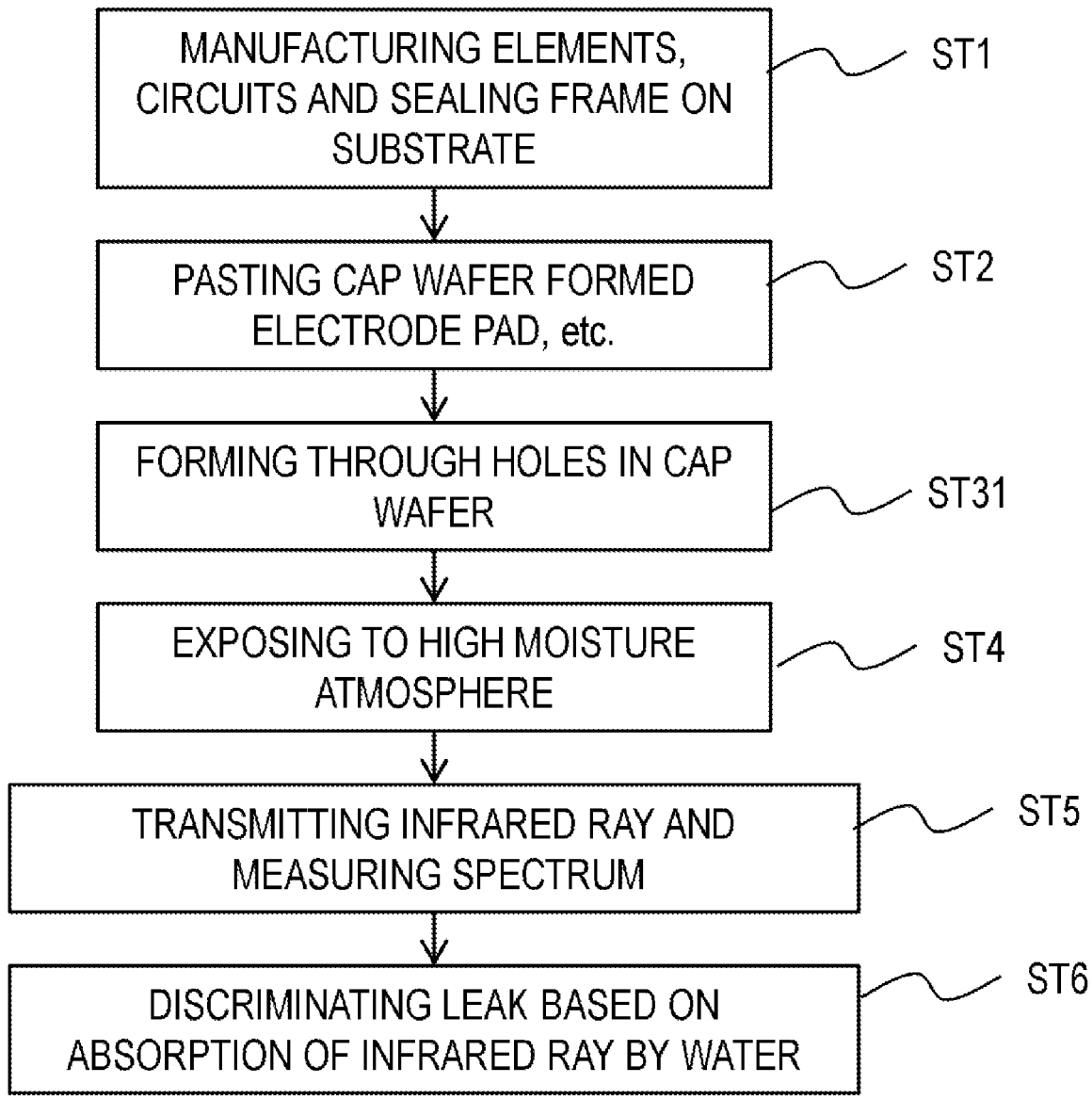
FIG. 11 is flow chart for showing a manufacturing method of a semiconductor device which includes a test method of a semiconductor device according to Embodiment 5 of this invention.

FIG. 10 is a diagram for describing a test method of a semiconductor device according to Embodiment 5 of this invention by using a cross-sectional view of a semiconductor device 200 which is an objective of the test. Further, FIG. 11 is flow chart showing a manufacturing method of a semiconductor device. In Embodiment 1, when a package is exposed to a high moisture atmosphere, in order for water to invade each package, it is necessary to cut each package into pieces. When a package is not cut into pieces, surroundings of each package are surrounded by other packages, therefore, water cannot be supplied from outside. In Embodiment 5, after a cap wafer is pasted (Step ST2), in order to supply water from outside to each package, in a cap wafer 3 which is situated between each of adjacent packages, a through hole 14 is formed (Step ST31). After that, the package is exposed to high moisture atmosphere (Step ST4). Water is supplied through the through hole 14 to each package.

Regarding a wafer level chip size package, in one wafer whose size is several inches, several hundreds to tens of thousands of packages are formed. When each package is individualized by dancing or scribing, handling, or measuring in post-process will be complicated. In Embodiment 5, water can be supplied to each package through the through hole 14, therefore, it is not necessary to individualize a wafer, and it is possible to evaluate a wafer itself. Therefore, handling will be easy, and processing will be simplified.

FIG. 11 shows a method of Embodiment 5 as an example of a method to discriminate a leak by detecting water after a package is exposed to a high moisture atmosphere. However, such a semiconductor device as shown in FIG. 10 can be applied to any test method described in above Embodiments 1 to 4.

Within the scope of this invention, each embodiment can be combined, or each embodiment can be approximately changed or omitted.

EXPLANATION OF REFERENCE CHARACTERS

1 substrate wafer
3 cap wafer
4 transistor (element)
7 airtight space
20 water
21 water film
100, 200 semiconductor device

The invention claimed is:

1. A test method of a semiconductor device having a package with an airtight space, which is provided between a substrate wafer in which an element is formed and a cap wafer which is made of a material which can transmit an infrared ray and is provided opposite to the substrate wafer, the test method comprising:
   a water applying process in which the semiconductor device is exposed to a moisture atmosphere; and
   a leak discrimination process in which an infrared ray transmitted from the semiconductor device is detected and a leak of the package is discriminated based on absorption of the infrared ray by water molecules are included, wherein
   the leak discrimination process comprises the steps of:
      supplying electric power to the element which is formed in the substrate wafer; and
      discriminating the leak of the package based on an infrared ray spectrum, which is radiated from the element and is radiated outside the package.

2. A method of manufacturing a semiconductor device comprising:
   forming elements on a substrate wafer;
   forming a package with an airtight space in an area where the elements exists, which is formed by providing a cap wafer made of a material through which an infrared ray can be transmitted, being opposite to the substrate wafer; and
   discriminating a leak in the package by the test method of a semiconductor device according to claim 1.

3. The method of manufacturing a semiconductor device according to claim 2, wherein
   the package forming process includes steps of:
      forming a plurality of packages with regard to one piece of the substrate wafer; and
      individualizing the packages to every package.

4. The method of manufacturing a semiconductor device according to claim 2, wherein
   the package forming process includes the steps of:
      forming a plurality of packages with regard to one piece of the substrate wafer; and
      forming a penetrating hole in the cap wafer which is between each of adjacent packages.

5. A test method of a semiconductor device having a package with an airtight space, which is provided between a substrate wafer in which an element is formed and a cap wafer which is made of a material which can transmit a light and is provided being opposite to the substrate wafer, the test method comprising:
   a water applying process in which the semiconductor device is cooled after the semiconductor device is exposed to a moisture atmosphere; and
   a leak discrimination process comprising the steps of:
      making light including light having a wavelength that can transmit the cap wafer incident into the cap wafer; and
      discriminating a leak of the package by ellipsometry.

6. A method of manufacturing a semiconductor device comprising:
   forming elements in a substrate wafer;
   forming a package with an airtight space, in an area where the elements exists, which is formed by providing a cap wafer made of a material through which a light can be transmitted, opposite to the substrate wafer; and
   discriminating a leak in the package by the test method of a semiconductor device according to claim 5.

7. The method of manufacturing a semiconductor device according to claim 6, wherein
   the package forming process includes the steps of:
      forming a plurality of packages with regard to one piece of the substrate wafer; and
      individualizing the plurality of packages to every package.

8. The method of manufacturing a semiconductor device according to claim 6, wherein
   the package forming process includes the steps of:
      forming a plurality of packages with regard to one piece of the substrate wafer; and
      forming a penetrating hole in the cap wafer which is between each of adjacent packages.

* * * * *